United States Patent
Kühner et al.

(10) Patent No.: US 10,019,098 B2
(45) Date of Patent: Jul. 10, 2018

(54) INPUT DEVICE FOR DETECTING A MANUAL ACTUATION

(71) Applicant: AUDI AG, Ingolstadt (DE)

(72) Inventors: Manuel Kühner, Markgroeningen (DE); Michael Wachinger, Winkelhausen (DE); Ulrich Müller, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/517,632

(22) PCT Filed: Nov. 27, 2015

(86) PCT No.: PCT/EP2015/002388
§ 371 (c)(1),
(2) Date: Apr. 7, 2017

(87) PCT Pub. No.: WO2016/096089
PCT Pub. Date: Jun. 23, 2016

(65) Prior Publication Data
US 2017/0308217 A1   Oct. 26, 2017

(30) Foreign Application Priority Data
Dec. 19, 2014  (DE) .................. 10 2014 019 241

(51) Int. Cl.
*G06F 3/041* (2006.01)
*G06F 3/044* (2006.01)

(52) U.S. Cl.
CPC ............ *G06F 3/0414* (2013.01); *G06F 3/044* (2013.01)

(58) Field of Classification Search
CPC ............................... G06F 3/0414; G06F 3/044

USPC ......................................................... 345/173
See application file for complete search history.

(56) References Cited

U.S. PATENT DOCUMENTS

| | | | |
|---|---|---|---|
| 2010/0156818 A1* | 6/2010 | Burrough | G06F 3/016 345/173 |
| 2011/0241442 A1 | 10/2011 | Mittleman et al. | |
| 2014/0333579 A1* | 11/2014 | Sleeman | G01L 1/146 345/174 |

FOREIGN PATENT DOCUMENTS

| | | |
|---|---|---|
| CN | 102549927 A1 | 7/2012 |
| DE | 112008001966 T5 | 6/2010 |
| DE | 102009032634 A1 | 1/2011 |
| DE | 102012102939 A1 | 10/2012 |
| DE | 102012203831 A1 | 9/2013 |
| DE | 102014019241.5 | 12/2014 |
| EP | 2 267 579 A1 | 12/2010 |
| EP | 2267579 A1 | 12/2010 |
| EP | 2 434 645 A1 | 3/2012 |
| WO | 2011/018439 A1 | 2/2011 |

(Continued)

OTHER PUBLICATIONS

English Translation by WIPO of the Internationals Preliminary Report on Patentability for PCT/EP2015/002388 dated Jun. 22, 2017.

(Continued)

*Primary Examiner* — Jonathan Boyd
(74) *Attorney, Agent, or Firm* — Staas & Halsey LLP

(57) ABSTRACT

A touch-sensitive sensor element is mounted movably such that it is movable in a direction of operation of a manual operation. The touch-sensitive sensor element is mechanically coupled to a force sensor element.

22 Claims, 1 Drawing Sheet

(56) References Cited

FOREIGN PATENT DOCUMENTS

WO    2011/018439 A1    2/2011

OTHER PUBLICATIONS

International Search Report for PCT/EP2015/002388; dated Jan. 29, 2016, 2 pp.
German Office Action for Application No. 102014019241.5 dated Oct. 29, 2015, 7 pp.
Chinese Office Action for Application No. 201580060632 dated Mar. 23, 2018.

* cited by examiner

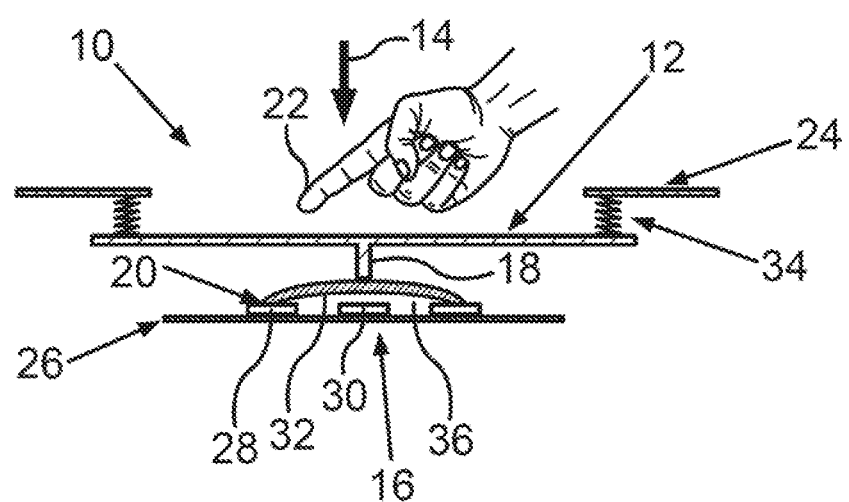

INPUT DEVICE FOR DETECTING A MANUAL ACTUATION

CROSS REFERENCE TO RELATED APPLICATIONS

This application is the U.S. national stage of International Application No. PCT/EP2015/002388, filed Nov. 27, 2015 and claims the benefit thereof. The International application claims the benefit of German Application No. 10 2014 019 241.5 filed on Dec. 19, 2014, both applications are incorporated by reference herein in their entirety.

BACKGROUND

Described below is an input device for ascertaining manual operation, having a touch-sensitive sensor element that is mounted movably in a direction of operation of the manual operation. Also described below is a vehicle having an input device as described.

Operating devices of the type in question are known in principle particularly also for use in vehicles, which means that separate documentary evidence is not required therefor. By way of example, input devices are touch-sensitive pushbutton switches that a vehicle occupant of a vehicle can use to activate and/or deactivate a control function by touch. Such control functions may be station selection for a car radio, activation and deactivation of a windshield wiper, adjustment of an automatically adjustable mirror, combinations of these and/or the like, for example.

Especially in the case of vehicles, but also in the case of other environments that have increased exposure to external mechanical influences, the problem can arise that operation is disrupted by an unforeseen movement of the vehicle or of an area in which the person effecting operation is standing or sitting. As such, the disrupting effect can mean that the originally intended input function is effected at an undesirably displaced spot or at an undesirably shifted time on account of the disruption. Although the resultant uncertainty of the input function can normally be reversed again by appropriate further inputs, this is complicated and awkward. Especially when the person effecting operation is a driver of a vehicle, this proves to be particularly disadvantageous because the driver can be distracted from his actual driving task by the multiplicity of further inputs that are now required.

Such an operating device is disclosed by DE 10 2012 203 831 A1, for example. In the case of this operating device, the sensor element is mounted movably in the direction of operation. The sensor element is prestressed counter to an operating force by a spring. When the sensor element is operated in the direction of operation, after it has been displaced by a prescribed travel, it operates an electrical switching element. No measurement of force takes place. Especially when used in vehicles, it is found to be disadvantageous that there is no connection of the sensor element to the switching element. This can lead to noise and also to malfunctions. The prestressing counter to an operating force promotes this disadvantage further.

SUMMARY

The input device described herein provides a more reliable input option or control option for a user or the person effecting operation.

This is accomplished by a touch-sensitive sensor element in the input device which is mechanically coupled to a force sensor element.

At the vehicle end, it is proposed that the vehicle has an input device as described.

By mechanically coupling the touch-sensitive sensor element to the force sensor element, the input device is able to make an improved decision, by evaluating a force signal from the force sensor element, as to whether operation sensed by the touch-sensitive sensor element actually corresponds to an operation that is desired by the person effecting operation. In this case, the input device assumes that desired operation by the person effecting operation involves not only the touch-sensitive element being touched but additionally also there being an action of force. Periodically, such a case arises, by way of example, when the person effecting operation moves his finger over the screen while looking for a desired function on a touch-sensitive screen, for example. As soon as he has located the desired function, he normally pushes the screen with a compressive force in order to be able to activate the desired selected function. However, the touch-sensitive screen frequently also senses positions of the finger that have been sensed while the finger was moving over the screen surface. This means that a series of undesirable operating actions are frequently sensed that the person effecting operation did not wish to activate at all in principle, however. The input device described herein allows this to be avoided. Since the touch-sensitive sensor element is mechanically coupled to the force sensor element, it is possible to achieve the effect that operation is sensed only when a sufficiently large action of force is also sensed at the same time. For this purpose, the touch-sensitive sensor element is mounted movably, so that an action of force on the touch-sensitive sensor element can lead to an action on the force sensor element. As a result, the force sensor element can be used to sense the compressive force applied by the finger of the person effecting operation.

The input device may be a touch-sensitive screen of a navigation device, for example. Furthermore, the input device may also be a touch-sensitive key, for example, that is used for activating and deactivating a control function of the vehicle. Such a function may be switching on the light, operating a handbrake, changing over a gearbox characteristic, combinations of these and/or the like, for example. Furthermore, the input device may also be connected to a radio, particularly a car radio in the case of a vehicle, or the like.

The force sensor element may be sensitive to an acting force only in one direction, e.g., by the force sensor element being connected to the touch-sensitive sensor element such that the direction to be sensed essentially matches the action of force to be expected on the touch-sensitive sensor element. This allows the accuracy of the sensed operation to be further improved.

The mechanical coupling between the touch-sensitive sensor element and the force sensor element may, in the simplest case, be produced by virtue of the force sensor element being in contact with the touch-sensitive sensor element. Furthermore, a coupling element may also be provided that is formed by an element that is essentially rigid in the intended mode and is able to transmit an action of force from the touch-sensitive sensor element to the force sensor element. The movable mounting can ensure that the action of force is also transmitted to the force sensor element on the basis of operation.

The input device also may include an evaluation unit to which the touch-sensitive sensor element and the force sensor element are connected. The evaluation unit evaluates electrical signals delivered by the touch-sensitive sensor element and the force sensor element and ascertains therefrom whether operation is occurring. If, by way of example, the touch-sensitive sensor element delivers a corresponding operation signal but the associated force sensor element does not, then the evaluation unit can be used to decide that this is not rated as operation because the appropriate action of force is missing.

The input device can have more than one touch-sensitive sensor element. Accordingly, for each of the touch-sensitive sensor elements, there may also be force sensor elements provided that are mechanically connected thereto. Alternatively, however, there may also be provision for the touch-sensitive sensor elements to be mounted movably on a common surface, and for just a single force sensor element to be provided for all of the touch-sensitive sensor elements. As a result, a plurality of touch-sensitive sensor elements can be used with just a single force sensor element. Naturally, combinations of these may also be provided.

In one development, the force sensor element is designed to produce an electrical force signal and, in accordance with the force acting, to assign a value from a prescribed plurality of at least three values to the force signal as per an explicit assignment instruction. This allows a downstream unit, such as the evaluation unit, for example, to evaluate the force signal and to infer a force that is actually applied in accordance with a value of the force signal. Every value of the force signal may have precisely one assigned value of the force that is acting. The assignment may be continuous, for example by virtue of an infinite plurality of values being provided, in accordance with an analog force measurement. However, there may also be provision for the force signal to be a coded digital signal. In this case, there may also be provision for rasterization by a finite plurality of values for the force signal. This allows discretization of the force signal, so that it is easily available for digital use. A particular advantage is assignment that is linear, so that there is a proportionality between the force signal and the force that is acting. Nevertheless, there may also be a different dependency on the basis of properties of the force measuring sensor, for example.

It is found to be particularly advantageous if the touch-sensitive sensor element has a force applied to it in the direction of the force sensor element. This configuration thus provides for an additional action of force to occur on the touch-sensitive sensor element in the direction of the operating force by a person effecting operation, which additional action of force also acts on the force sensor element at the same time. This has the advantage that, particularly in an environment in which large accelerations occur, the mechanical coupling can be achieved even when the touch-sensitive sensor element is merely in contact with the force sensor element. Clattering noises and the like and malfunctions can be reduced thereby. Furthermore, this configuration allows the force sensor to be put into a prescribable operating state in which a force measurement can be performed particularly advantageously.

The input device can also be combined with actuators that allow haptic feedback from the touch-sensitive sensor element to be produced. Particularly advantageously, there is provision, to this end, for the haptic feedback to be provided only after the operation by the actuator on the touch-sensitive sensor element is sensed. This allows temporal decoupling to be achieved.

In one development, the touch-sensitive sensor element has a contact-connection projection in the direction of the force sensor element that mechanically couples the force sensor element. This allows distances between the touch sensitive sensor element and the force sensor element to be spanned. The contact-connection projection can further be used to achieve the effect of adjustability, which allows the mechanical coupling between the touch-sensitive sensor element and the force sensor element to be taken into consideration on the basis of the spatial ambient conditions in which these elements are arranged.

Further, it is proposed that the input device has an actuator that is mechanically coupled to the touch-sensitive sensor element.

One advantageous configuration additionally provides for the touch-sensitive sensor element to be formed integrally with the force sensor element. This allows a compact assembly to be provided that can easily be processed further. Furthermore, this configuration is further suitable for providing checked assemblies whose interaction essentially does not change again during the further processing. This allows production to be improved further, particularly with regard to reliability.

According to a further configuration, it is proposed that at least the force sensor element is arranged in moisture-proof fashion. The effect that can be achieved by the moisture-proof arrangement is that the force sensor element can perform its force measurement reliably and largely without drift in the intended mode even under different atmospheric conditions. This allows reliability to be improved further overall.

According to a further configuration, it is proposed that the force sensor element has a capacitive measuring unit. The capacitive measuring unit can be used to ascertain a force in a simple and reliable manner. For this purpose, an elastic, electrically conductive diaphragm, for example, can be arranged opposite a further electrically conductive area in electrically insulated fashion. A force to be measured acts on the diaphragm, so that the distance between the diaphragm and the opposing area is changed in accordance with the force and the elasticity of the diaphragm. This change can be ascertained by a capacitance measuring instrument. By comparing a measured capacitance with previously stored values, for example, it is then possible to infer the force that is actually acting. The force sensor element having a capacitive measuring unit of this kind then delivers a corresponding force signal as output signal.

According to a further configuration, it is proposed that the force sensor element has a further capacitive measuring unit as a reference unit, the force sensor element being set up to produce the force signal by taking into consideration a reference signal provided by the reference unit. The reference unit may be an identical capacitive measuring unit, for example. This has an unalterable constant force applied to it, which means that it is preferably always under the same load. By comparing a measurement result from the reference unit with a measurement result from the capacitive measuring unit, it is then possible to infer the force difference. By taking into consideration the permanently preset force for the reference unit, it is then possible to ascertain the force that is actually acting and to output a corresponding force signal. For this purpose, the reference unit produces a reference signal that is taken into consideration by the force measuring sensor for ascertaining the force signal. This makes it possible to compensate for drift, particularly long-term drift, temperature influences, moisture influences and/or the like. Overall, this configuration allows measurement accuracy to be increased further.

Accordingly, one development proposes that the input device has an evaluation unit that ascertains the manual operation by receiving, and evaluating in combination, a touch signal delivered by the touch-sensitive sensor element and the force signal delivered by the force sensor element, the evaluation unit being set up to take a result of the combined evaluation as a basis for outputting an operating signal. The combined evaluation can provide for a combined signal to be formed, for example by addition of the individual signals, and for this combined signal to be compared with a comparison value. On the basis of a comparison result, the operating signal is then produced, which indicates sensed manual operation. Furthermore, the force signal and the touch signal can also each be compared with a respective comparison value associated with these signals. On the basis of the two comparison results, the operating signal is then produced. Naturally, there may also be provision for a combination of these.

BRIEF DESCRIPTION OF THE DRAWINGS

These and other aspects, advantages and features can be found in the following description of an exemplary embodiment with reference to the accompanying drawing. The exemplary embodiment serves merely to explain the invention and is nonlimiting therefor. Reference symbols used in the drawing denote like components and functions.

The single FIGURE is a cross section of an input device in which a touch pad is mechanically coupled as a touch-sensitive sensor element to a force sensor element.

DETAILED DESCRIPTION OF THE PREFERRED EMBODIMENT

Reference will now be made in detail to the preferred embodiments, examples of which are illustrated in the accompanying drawings, wherein like reference numerals refer to like elements throughout.

The single FIGURE shows an input device 10 that is used for ascertaining manual operation. The input device 10 has a touch pad 12 as a touch-sensitive sensor element that is mounted movably in a direction of operation 14 of manual operation. In the present case, the touch pad 12 is in the form of a capacitive touch pad and is electrically connected to an evaluation unit, not depicted. The touch pad 12 detects operation by a finger 22 of a user and delivers a corresponding signal to the evaluation unit. In the present case, the touch pad 12 is in the form of a rigid, plate-like assembly and mounted displaceably in the direction of operation 14. The displaceable mounting is not depicted further here, because it may be configured arbitrarily in principle without altering the core concept of the input device. The touch pad 12 is arranged in an opening, not denoted, in a housing 24 of the input device 10. When the finger 22 is used to exert a compressive force on the touch pad 12 in the direction of operation 14, the position of the touch pad 12 as depicted in the FIGURE is displaced relative to the housing 24, likewise in the direction of operation 14. In the present case, the operating principle of the touch pad 12 is based on sensing of capacitive changes. Alternatively, however, it is also possible to use a touch pad whose operating principle is based on sensing of optical changes.

In the FIGURE, a force sensor element 16 is arranged beneath the touch pad 12. The force sensor element 16 is mechanically coupled to the touch pad 12 via a plunger 18, connected to the touch pad 12 on the reverse, as a contact-connection projection. The plunger 18 points from the touch pad 12 in the direction of the force sensor element 16. The touch pad 12 and the plunger 18 are formed integrally with one another in the present case. The arrangement is chosen such that the plunger 18 is in contact with the force sensor element 16.

The force sensor element 16 has a printed circuit board 26 on which a conductor track arrangement is provided that, together with a cover 32 made of sheet brass, forms a capacitive measuring unit 20. For this purpose, the printed circuit board has a conductor track 28 in annular form within which a further annular conductor track 30 is arranged in a manner electrically insulated from the conductor track 28. The cover 32, like the conductor track 28, is likewise in annular form with a comparable radius, so that its outer circumference is supported on the conductor track 28. At the same time, the cover 32 is curved, so that there is a distance between the cover 32 and the conductor track 30. This arrangement produces a capacitance between the conductor tracks 28, 30 that is able to be measured by a capacitance measuring unit, not depicted. The capacitance measuring unit delivers a corresponding force signal likewise to the evaluation unit.

The capacitance of the capacitive measuring unit 20 is dependent on how great the distance is between the conductor track 30 and the cover 32. When the plunger 18 is used to exert a compressive force acting in the direction of operation 14 on the touch pad 12 by the finger 22, the touch pad 12 and the plunger 18 connected thereto are displaced in accordance with the action of force. As a result, the plunger 18 pushes on the cover 32, so that the curvature thereof is reduced. Overall, this reduces the distance between the cover 32 and the conductor track 30, so that the capacitance of the capacitive measuring unit 20 is increased. Accordingly, the capacitive measuring unit 20 produces a corresponding signal that is transmitted to the evaluation unit.

The evaluation unit receives the signals from the touch pad 12 and from the force sensor element 16 and produces a control signal only if an adequate signal from both the touch pad 12 and the force sensor element 16 has been sensed. For this purpose, the signals can each be compared with a comparison value, the control signal being produced only if each of the signals by itself exceeds the comparison value respectively associated with it.

In order to ensure a reliable connection between the plunger 18 and the cover 32, there is further provision for the touch pad 12 to have a force applied to it relative to the housing 24 in the direction of the force sensor element 16. For this purpose, prestressing springs 34 are provided that are arranged between the housing 24 and the touch pad 12. The prestressing springs 34 thus produce a prestress in the direction of operation 14, that is to say in the same direction as that in which a compressive force acts that a user applies to the touch pad 12 with his finger 22 in order to activate an operating function.

The FIGURE does not depict that the capacitive measuring unit 20 is protected against moisture. For this purpose, a cavity 36 that is formed between the cover 32 and the printed circuit board 26 is filled with an elastic, compressible plastic. This ensures that the entry of moisture or liquid into the cavity 36 is largely prevented. This is because the entry of liquid or moisture can alter or corrupt the capacitance of the capacitive measuring unit 20 on account of different dielectric properties, meaning that reliable functioning could be impaired. The sealing function now precludes this possibility, so that permanently reliable functioning of the capacitive measuring unit 20 can be achieved.

The design as has just been described furthermore has the advantage that the plunger 18 no more needs to be permanently connected to the cover 32 than the cover 32 to the conductor track 28. For the intended functioning, it is sufficient for the relevant components to be arranged as depicted in the FIGURE. The prestress produced by the prestressing springs 34 then allows cohesion of the structure to be achieved.

The exemplary embodiment serves merely to explain the invention and is nonlimiting therefor. Naturally, it is possible for functions to be designed arbitrarily, particularly also with reference to the evaluation or acoustic coupling, without departing from the concept of the invention. Furthermore, the invention is naturally not limited just to use in vehicles, but rather can naturally be used for any input devices, that is to say including for radios, domestic appliances or the like. The effect that can be achieved by the force sensor is that operation can be identified reliably.

Finally, it should be noted that the advantages and features and also embodiments described for the device according to the invention apply in equal measure to a corresponding method, and vice versa. Therefore, corresponding method features may be provided for apparatus features, and vice versa.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV*, 358 F3d 870, 69 USPQ2d 1865 (Fed. Cir. 2004).

The invention claimed is:

1. An input device for ascertaining a manual operation, comprising:
   a touch-sensitive sensor element mounted movably in a direction of operation of the manual operation; and
   a force sensor element, mechanically coupled to the touch-sensitive sensor element, having
      a capacitive measuring unit measuring a variable capacitance varying with force applied to the force sensor element, and
      a reference capacitive measuring unit measuring a reference capacitance substantially unaffected by the force applied to the force sensor element, the force sensor element producing a force signal by taking into consideration the variable capacitance and the reference capacitance provided by the reference capacitive measuring unit.

2. The input device according to claim 1, wherein the force sensor element produces an electrical force signal, corresponding to a force acting on the touch-sensitive sensor element, by assigning a value from a prescribed plurality of at least three values based on an explicit assignment instruction.

3. The input device according to claim 1, further comprising a prestress force element prestressing the touch-sensitive sensor element with a prescribed force in the direction of operation.

4. The input device according to claim 3, wherein the prestress force element includes at least one spring exerting the prescribed force on the touch-sensitive sensor element towards the force sensor element.

5. The input device according to claim 4, wherein the touch-sensitive sensor element includes a contact-connection projection in the direction of operation, providing mechanical coupling of the force sensor element to the touch-sensitive sensor element.

6. The input device according to claim 5,
   wherein the touch-sensitive sensor element outputs a touch signal, and
   wherein the input device further comprises a hardware processor, receiving the touch signal from the touch-sensitive sensor element and the force signal from the force sensor element, programmed to output an operating signal based on the touch signal and the force signal.

7. The input device according to claim 6, wherein the hardware processor outputs the operating signal indicating a touch on the touch-sensitive sensor element when a difference between the capacitance and the reference signal is greater than a first predetermined value when the touch signal indicates that the touch-sensitive sensor element is being touched.

8. The input device according to claim 1, wherein the touch-sensitive sensor element includes a contact-connection projection in the direction of operation, providing mechanical coupling of the force sensor element to the touch-sensitive sensor element.

9. The input device according to claim 1, further comprising an actuator mechanically coupled to the touch-sensitive sensor element.

10. The input device according to claim 1, wherein the touch-sensitive sensor element is formed integrally with the force sensor element.

11. The input device according to claim 1, wherein at least the force sensor element is arranged in moisture-proof fashion.

12. The input device according to claim 1, further comprising an evaluation unit ascertaining the manual operation by receiving, and evaluating in combination, a touch signal delivered by the touch-sensitive sensor element and the force signal delivered by the force sensor element, the evaluation unit performing a combined evaluation of the touch signal and the force signal as a basis for outputting an operating signal.

13. The input device according to claim 1, wherein the reference capacitive measuring unit is configured substantially identical to the capacitive measuring unit.

14. A motor vehicle, comprising:
   a chassis; and
   an input device producing an operating signal in response to a manual operation, including
      a touch-sensitive sensor element mounted movably in a direction of operation of the manual operation; and
      a force sensor element, mechanically coupled to the touch-sensitive sensor element, having
         a capacitive measuring unit measuring a variable capacitance varying with force applied to the force sensor element, and
         a reference capacitive measuring unit measuring a reference capacitance substantially unaffected by the force applied to the force sensor element, the force sensor element producing a force signal by taking into consideration the variable capacitance and the reference capacitance provided by the reference capacitive measuring unit.

15. The motor vehicle according to claim 14, wherein the input device further comprises a prestress force element prestressing the touch-sensitive sensor element with a prescribed force in the direction of operation.

16. The motor vehicle according to claim 15, wherein the prestress force element includes at least one spring exerting the prescribed force on the touch-sensitive sensor element towards the force sensor element.

17. The motor vehicle according to claim 16, wherein the touch-sensitive sensor element includes a contact-connection projection in the direction of operation, mechanically coupling the force sensor element and the touch-sensitive sensor element.

18. The motor vehicle according to claim 17,
wherein the touch-sensitive sensor element outputs a touch signal, and
wherein the input device further comprises a hardware processor, receiving the touch signal from the touch-sensitive sensor element and the force signal from the force sensor element, programmed to output an operating signal based on the touch signal and the force signal.

19. The motor vehicle according to claim 14, wherein the touch-sensitive sensor element includes a contact-connection projection in the direction of operation, mechanically coupling the force sensor element and the touch-sensitive sensor element.

20. The motor vehicle according to claim 14,
wherein the touch-sensitive sensor element outputs a touch signal, and
wherein the input device further comprises a hardware processor, receiving the touch signal from the touch-sensitive sensor element and the force signal from the force sensor element, programmed to output an operating signal based on the touch signal and the force signal.

21. The motor vehicle according to claim 20, wherein the hardware processor outputs the operating signal indicating a touch on the touch-sensitive sensor element when a difference between the capacitance and the reference signal is greater than a first predetermined value when the touch signal indicates that the touch-sensitive sensor element is being touched.

22. The motor vehicle according to claim 14, wherein the reference capacitive measuring unit is configured substantially identical to the capacitive measuring unit.

* * * * *